United States Patent
Heller et al.

(10) Patent No.: US 10,681,845 B2
(45) Date of Patent: Jun. 9, 2020

(54) SYSTEMS AND METHODS THAT USE THERMAL ENERGY TRANSFER DEVICES TO REDUCE THERMAL ENERGY WITHIN ENVIRONMENTS

(71) Applicant: Lenovo Enterprise Solutions (Singapore) Pte. Ltd., New Tech Park (SG)

(72) Inventors: Matthew Aaron Heller, Raleigh, NC (US); Jeffrey Scott Holland, Raleigh, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 0 days.

(21) Appl. No.: 15/935,481

(22) Filed: Mar. 26, 2018

(65) Prior Publication Data
US 2019/0297746 A1    Sep. 26, 2019

(51) Int. Cl.
*H05K 7/20* (2006.01)

(52) U.S. Cl.
CPC ..... *H05K 7/20772* (2013.01); *H05K 7/20127* (2013.01); *H05K 7/20154* (2013.01); *H05K 7/20254* (2013.01); *H05K 7/20272* (2013.01); *H05K 7/20709* (2013.01); *H05K 7/20727* (2013.01)

(58) Field of Classification Search
CPC ........... H05K 7/20772; H05K 7/20127; H05K 7/20254; H05K 7/20727; H05K 7/20709; H05K 7/20154; H05K 7/20272; H05K 7/20963; H05K 7/20972; H05K 7/20509; H01L 23/46; G06F 1/20; G06F 1/203; G06F 1/206; G06F 2200/201
USPC .............. 361/679.47, 679.54, 698, 702, 704, 361/709–713
See application file for complete search history.

(56) References Cited

U.S. PATENT DOCUMENTS

| | | | | |
|---|---|---|---|---|
| 6,623,514 B1 * | 9/2003 | Chin | ........................ | A61F 7/12 604/113 |
| 2002/0191430 A1 * | 12/2002 | Meir | ........................ | G06F 1/20 363/141 |
| 2004/0187501 A1 * | 9/2004 | Sauciuc | .................. | F25B 21/02 62/3.7 |
| 2006/0227504 A1 * | 10/2006 | Chen | ..................... | H01L 23/467 361/679.47 |
| 2008/0006037 A1 * | 1/2008 | Scott | ......................... | G06F 1/20 62/3.6 |
| 2008/0259566 A1 * | 10/2008 | Fried | .................. | H05K 7/20809 361/699 |
| 2008/0264614 A1 * | 10/2008 | Szolyga | ............... | H05K 5/0213 165/104.33 |

(Continued)

*Primary Examiner* — Jayprakash N Gandhi
*Assistant Examiner* — Stephen S Sul
(74) *Attorney, Agent, or Firm* — Olive Law Group, PLLC

(57) ABSTRACT

Systems and methods that use thermal energy transfer devices to reduce thermal energy within environments are disclosed. According to an aspect, a method includes using a cool sink to transfer thermal energy from an environment. The method also includes using a thermal energy transfer device to transfer the thermal energy to liquid within a conduit. Further, the method includes transporting the liquid containing the transferred thermal energy away from the environment such that the thermal energy within the environment is reduced.

20 Claims, 3 Drawing Sheets

(56) References Cited

U.S. PATENT DOCUMENTS

| | | | |
|---|---|---|---|
| 2009/0100841 A1* | 4/2009 | Kahn | G06F 1/20 62/3.2 |
| 2012/0192574 A1 | 8/2012 | Ghoshal | F25B 21/02 62/3.2 |
| 2012/0201008 A1* | 8/2012 | Hershberger | H05K 1/0203 361/720 |
| 2014/0198438 A1* | 7/2014 | Aurongzeb | G06F 1/20 361/679.02 |
| 2015/0043156 A1* | 2/2015 | Jain | H04M 1/72575 361/679.46 |
| 2015/0194286 A1* | 7/2015 | Karlstedt | H05G 1/025 378/62 |
| 2015/0267944 A1* | 9/2015 | Duwel | F25B 21/00 62/3.1 |
| 2017/0315595 A1* | 11/2017 | Kulkarni | G06F 1/20 |
| 2018/0004259 A1* | 1/2018 | Kulkarni | G06F 1/20 |
| 2019/0098799 A1* | 3/2019 | Richards | H05K 7/20863 |

* cited by examiner

SYSTEMS AND METHODS THAT USE THERMAL ENERGY TRANSFER DEVICES TO REDUCE THERMAL ENERGY WITHIN ENVIRONMENTS

TECHNICAL FIELD

The presently disclosed subject matter relates to cooling environments and equipment. More particularly, the presently disclosed subject matter relates to systems and methods that use thermal energy transfer devices to reduce thermal energy within environments.

BACKGROUND

Computing devices produce heat during use and can overheat with prolonged use. Overheating can result in malfunction or catastrophic damage to the computing devices. In a server farm or other computing environment, servers can cause the environment to overheat and generally be expensive to regulate.

Current techniques to reduce the amount of heat generated by computing devices within such environments have included using conventional air conditioning and chilled liquid cooling. The use of cooling liquids can require a direct coupling between the liquid and the computing device, which may not always be possible or feasible. In such a case, thermal energy can still pass to the surrounding air, further heating the environment.

Despite advances in computing device cooling, there is a continuing need for better cooling systems and techniques to improve computing device efficiency and to reduce energy consumption.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Disclosed herein are systems and methods that use thermal energy transfer devices to reduce thermal energy within environments. According to an aspect, a method includes using a cool sink to transfer thermal energy from an environment. The method also includes using a thermal energy transfer device to transfer the thermal energy to liquid within a conduit. Further, the method includes transporting the liquid containing the transferred thermal energy away from the environment such that the thermal energy within the environment is reduced.

According to another aspect, a method includes providing a computing device having an interior space that is substantially sealed, wherein the interior space contains one or more electronic components. The method also includes using a cool sink to transfer thermal energy from the interior space. Further, the method includes using a thermal energy transfer device to transfer the thermal energy to liquid within a conduit. The method also includes transporting the liquid containing the transferred thermal energy away from the interior space such that the thermal energy within the interior space is reduced.

According to another aspect, a system includes a computing device having an interior space that is substantially sealed. The interior space contains one or more electronic components. The system also includes a cool sink positioned within the interior space for transfer of thermal energy from the interior space. Further, the system includes a conduit containing liquid and thermal-conductively connected to the cold sink. The system also includes a thermal energy transfer device configured to transfer the thermal energy to the liquid within the conduit. Further, the system includes a pump configured to move liquid containing the transferred thermal energy away from the interior space.

BRIEF DESCRIPTION OF THE DRAWINGS

The foregoing summary, as well as the following detailed description of various embodiments, is better understood when read in conjunction with the appended drawings. For the purposes of illustration, there is shown in the drawings exemplary embodiments; however, the presently disclosed subject matter is not limited to the specific methods and instrumentalities disclosed. In the drawings.

DETAILED DESCRIPTION

The presently disclosed subject matter is described with specificity to meet statutory requirements. However, the description itself is not intended to limit the scope of this patent. Rather, the inventors have contemplated that the claimed subject matter might also be embodied in other ways, to include different steps or elements similar to the ones described in this document, in conjunction with other present or future technologies.

A "computing device" should be broadly construed. It can include any type of device including hardware, software, firmware, the like, and combinations thereof. A computing device may include one or more processors and memory or other suitable non-transitory, computer readable storage medium having computer readable program code for implementing methods in accordance with embodiments of the present disclosure. A computing device may be, for example, a server. In another example, a computing device may be any type of conventional computer, such as a laptop computer or a tablet computer or a desktop computer. In another example, the computing device may be a type of network device such as a router or a switch. In another example, the computing device may be a smart television or a high definition television. In another example, the computing device may be a battery powered Internet of Things (IoT) device. In another example, computing devices may use graphical displays and can access the Internet (or other communications network) on so-called mini- or micro-browsers, which are web browsers with small file sizes that can accommodate the reduced memory constraints of wireless networks. Although many of the examples provided herein are implemented on servers in a datacenter, the examples may similarly be implemented on any suitable computing device or computing devices.

Figure 1:
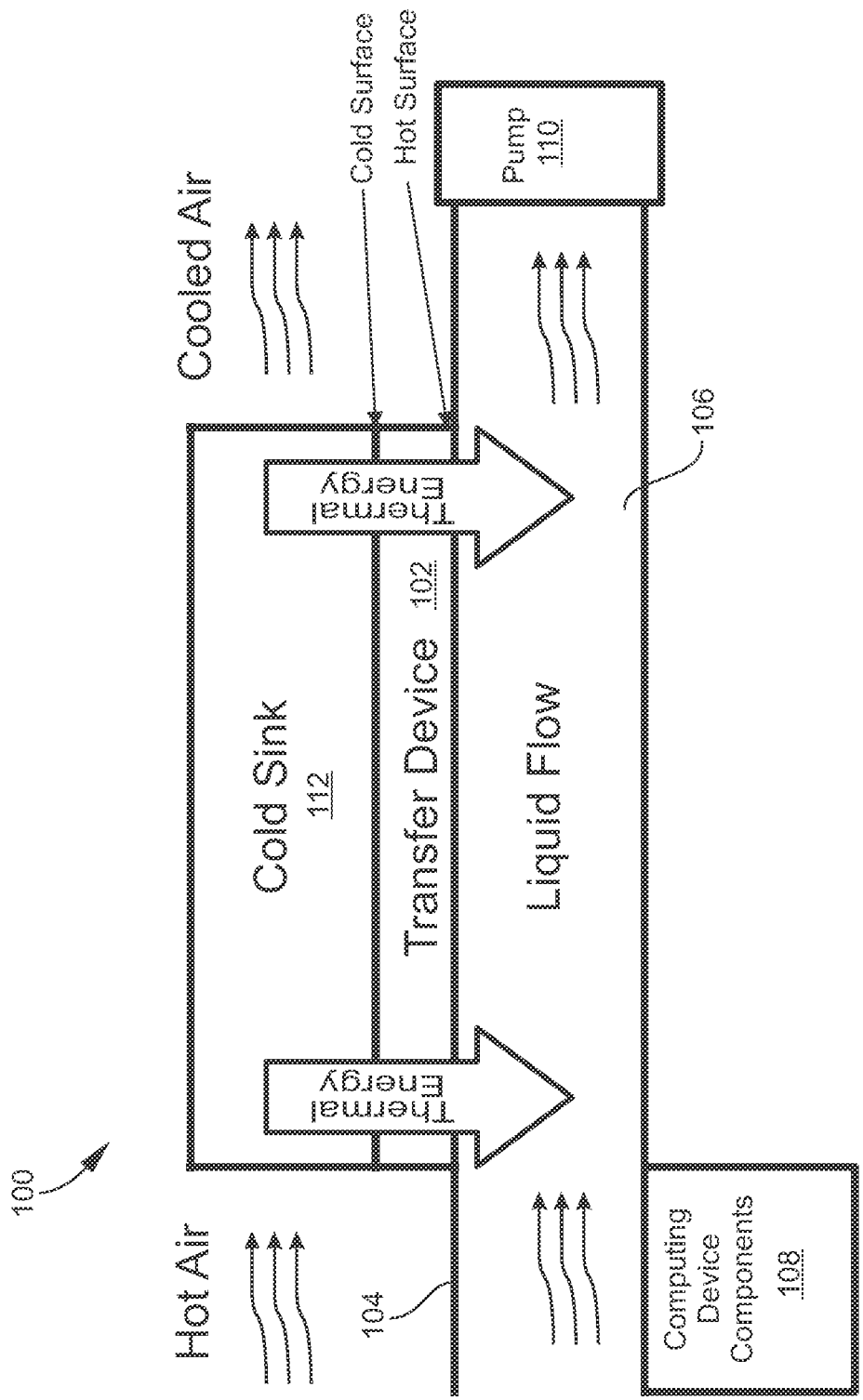
FIG. 1 is a diagram of an example system that uses a thermal energy transfer device to reduce thermal energy within an environment in accordance with embodiments of the present disclosure.

FIG. 1 illustrates a diagram of an example system 100 that uses a thermal energy transfer device 102 to reduce thermal energy within an environment in accordance with embodiments of the present disclosure. In this example, the system 100 is contained within an environment such as within a computing device. For example, the system 100 can be contained within an insulated housing of a computing device, such as a server. For example, the elements shown in FIG. 1 may be contained within an interior space of a computing device that is substantially sealed.

Referring to FIG. 1, the thermal energy transfer device 102 is positioned in proximity to a conduit 104 carrying liquid 106 for cooling one or more components 108 of a computing device. In an example, the component(s) 108 may be electronic components of a computing device that are subject to producing excessive heat, such as a processor. The conduit 104 may be suitably positioned in proximity to the component(s) 108 such that thermal energy generated by the component(s) 108 is transferred to the liquid 106 contained in the conduit 104. Example liquid is, but not limited to, water. Example water can be warm water in accordance with American Society of Heating, Refrigerating and Air-Conditioning Engineers (ASHRAE) Standard W4 or the like. The conduit 104 can be operably connected to a pump 110 that is configured to transport the liquid 106 through the conduit 104. As a result, thermal energy generated by the component(s) 108 can be received by the liquid 106 and transported away the environment.

The component(s) 108 can generate heat that is received by air or other gas surrounding the component(s) 108 and the conduit 104. The air or other gas may be referred to as a cold sink, because it is generally cooler than the component(s) and thus receives thermal energy from the component(s) 108.

The thermal energy transfer device 102 can be positioned such that its surface touches an outside surface of the conduit 104, or such that its surface is in close proximity to the conduit 104. In addition, another surface of the thermal energy transfer device 102 may be in contact with the cold sink 112. The thermal energy transfer device 102 may be configured to transfer thermal energy from the cold sink 112 to liquid within the conduit 104.

In an example, the thermal energy transfer device 102 is a thermoelectric cooler (TEC). The TEC uses the Peltier effect to create a heat flux between the junction of two different types of material. The TEC may transfer thermal energy from one side of the device to the other, with consumption of electrical energy. In the example of FIG. 1, the TEC may be positioned and configured to transfer thermal energy from the cold sink 112 to the liquid 106 for carry away from the environment.

Figure 2:
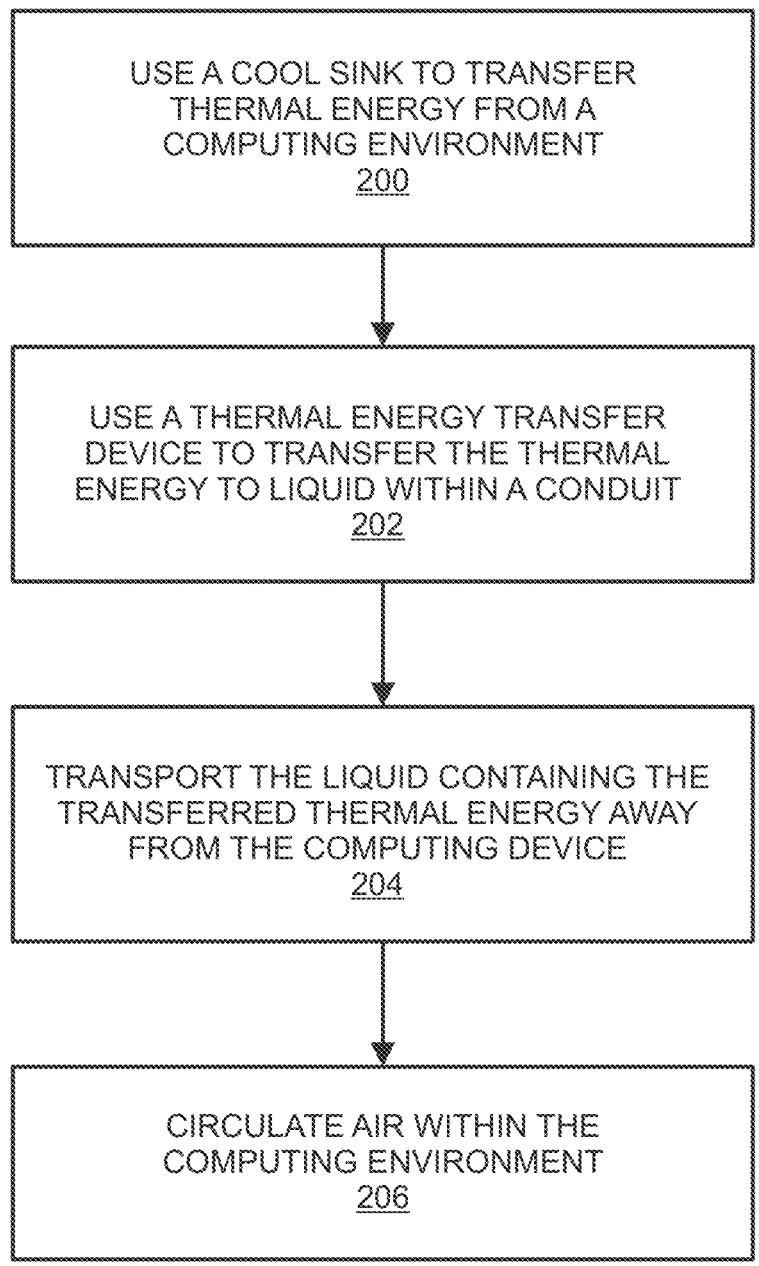
FIG. 2 is a flowchart of an example method for using a thermal energy transfer device to reduce thermal energy within an environment in accordance with embodiments of the present disclosure.

In accordance with the embodiments, FIG. 2 illustrates a flowchart of an example method for using a thermal energy transfer device to reduce thermal energy within a environment in accordance with embodiments of the present disclosure. The method of FIG. 2 is described by example as being implemented by the system shown in FIG. 1, although it should be understood that the method may be implemented by any suitable system.

The method includes using 200 a cool sink to transfer thermal energy from an environment. For example, the cold sink 112 shown in FIG. 1 may be used to transfer thermal energy from the environment. Particularly, the cold sink 112 may attract the ambient heat from within the environment due to the temperature differences between the cold sink 112 and the environment.

With continuing reference to FIG. 2, the method includes using 202 a thermal energy transfer device to transfer the thermal energy to liquid within a conduit. Continuing the aforementioned example, the thermal energy transfer device may be a TEC. The TEC may be positioned as described with respect to FIG. 1. Also, electrical power may be suitably supplied to the TEC to cause the TEC to transfer the thermal energy from the cold sink 112 to the liquid 106.

The method of FIG. 2 includes transporting 204 the liquid containing the transferred thermal energy away from the computing device such that the thermal energy within the environment is reduced. In an example, a pump, such as a water pump, can be used to transport the liquid through the conduit 104 and away from the environment. The liquid may be transported to an external cooling source and returned to the system 100 for cooling.

FIG. 2 may also include circulating 206 air within the environment. Continuing the aforementioned example, the circulation of air can help facilitate the absorption of the ambient heat by the cold sink 112. This circulation can be done either by natural convection or an air moving device, such as a fan, to facilitate the absorption of the ambient heat via the cold sink 112.

Figure 3:
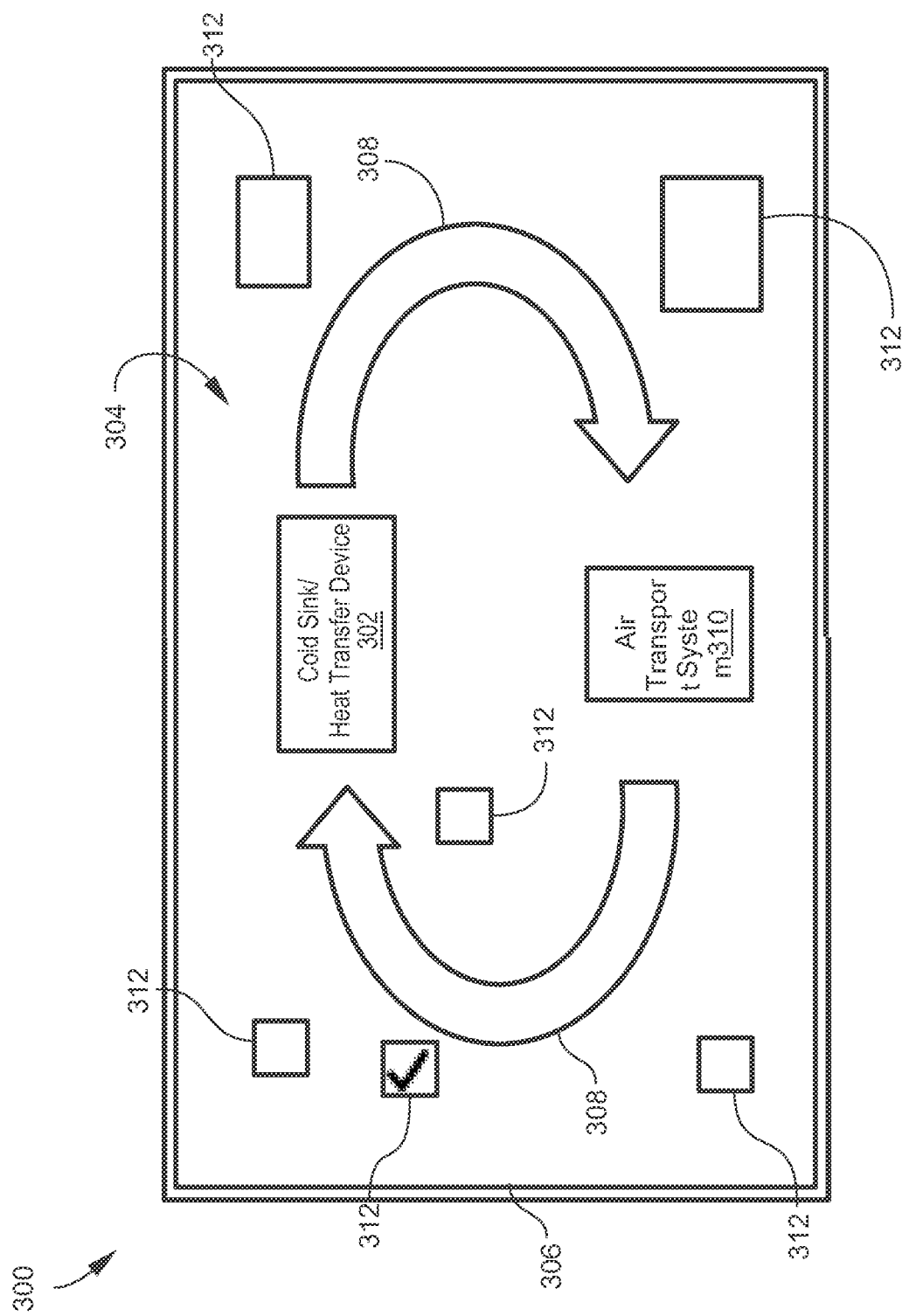
FIG. 3 is a diagram of another example system that uses a thermal energy transfer device and a cold sink to reduce thermal energy within an environment in accordance with embodiments of the present disclosure.

FIG. 3 illustrates a diagram of another example system 300 that uses a thermal energy transfer device and a cold sink 302 to reduce thermal energy within an environment 304 in accordance with embodiments of the present disclosure. Referring to FIG. 3, the environment 304 of the device may be substantially sealed by insulation 306 for minimizing heat transfer to the outside environment. The insulation 306 may be any suitable housing used for computing equipment or other electronic equipment. The insulation 306 may provide improved absorption of ambient heat via the cold sink operably attached to the thermal energy transfer device. In an example, the system 300 can be a server, an electronic device, a computing device (e.g., a server), or any other such suitable device. Air within the system 300 may be suitably circulated in the directions indicated by arrows 308. A suitably configured air transport system or fan 310 may be positioned within the system 300 for circulating the air for facilitating the absorption of the ambient heat by the cold sink 504. The system may include various components 312. In an example, the components 502 can be electronic components.

In accordance with embodiments, the presently disclosed systems and methods may be used in a liquid-assisted scenario in which the liquid is circulated in a closed loop within a machine or rack, and room air through a radiator passes the heat energy into the room. This may be implemented when specific devices (e.g., CPU on a server or other computing device) require removal of high-density heat and traditional heat sinks are insufficient. A TEC or other thermal energy transfer device may be added to such a liquid loop to capture heat from the air within the machine that may not passively pass to the water otherwise. That heat can pass through the TEC into the flowing liquid and exhausted remotely.

Aspects of the present subject matter are described herein with reference to flowchart illustrations and/or block diagrams of methods, apparatus (systems), and computer program products according to embodiments of the subject matter. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present subject matter. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments have been described in connection with the various embodiments of the various figures, it is to be understood that other similar embodiments may be used or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A method comprising:
    transferring a first portion of thermal energy from an environment within a computing device, wherein the computing device includes a cold sink and a thermal energy transfer device;
    transferring the first portion of thermal energy to a liquid within a conduit using the thermal energy transfer device that is physically positioned between the cold sink and the conduit such that a first surface of the thermal energy transfer device is outside a surface of the conduit and a second surface of the thermal energy transfer device is in contact with the cold sink;
    capturing, using the thermal energy transfer device, a second portion of thermal energy still present within the environment while the thermal energy transfer device transfers the first portion of the thermal energy to the liquid within the conduit;
    transporting the first portion thermal energy into the liquid;
    and
    transporting the liquid containing the first portion of thermal energy away from the environment such that the thermal energy within the environment is reduced.

2. The method of claim 1, wherein the temperature of the liquid after transfer of the first portion of thermal energy is greater than the temperature of the environment.

3. The method of claim 1, wherein the thermal energy transfer device comprises a thermoelectric cooler.

4. The method of claim 1, wherein transporting the liquid comprises using a pump to transport the liquid.

5. The method of claim 1, wherein the liquid comprises water.

6. The method of claim 1, further comprising moving air within the environment via convection.

7. The method of claim 1, further comprising moving air within the environment via an air transport device.

8. The method of claim 1, wherein the environment comprises at least one server component.

9. The method of claim 1, wherein the environment is contained within an insulated housing for one or more electronic components.

10. A method comprising:
    providing a computing device having an interior space that is substantially sealed, wherein the interior space contains one or more electronic components;
    transfer transferring a first portion of thermal energy from the interior space within the computing device, wherein the computing device includes a cold sink and a thermal energy transfer device;
    transferring the first portion of thermal energy to a liquid within a conduit using the thermal energy transfer device that is physically positioned between the cold sink and the conduit such that a first surface of the one thermal energy transfer device is outside a surface of the conduit and a second surface of the one thermal energy transfer device is in contact with the cold sink;
    capturing, using the thermal energy transfer device, a second portion of thermal energy still present within the interior space while the one thermal energy transfer device transfers the first portion of the thermal energy to the liquid within the conduit;
    transporting the first portion thermal energy into the liquid;
    and
    transporting the liquid containing the first portion of thermal energy away from the interior space such that the thermal energy within the interior space is reduced.

11. The method of claim 10, wherein the computing device comprises a server.

12. The method of claim 10, wherein the temperature of the liquid after transfer of the first portion of thermal energy is greater than the temperature of the interior space.

13. The method of claim 10, wherein the thermal energy transfer device comprises a thermoelectric cooler.

14. A system comprising:
    a computing device having an interior space that is substantially sealed, wherein the interior space contains one or more electronic components;
    a cool sink positioned within the interior space for transfer of a first portion of thermal energy from the interior space;
    a conduit containing a liquid and thermal-conductively connected to the cold sink;
    a thermal energy transfer device that is positioned between the cold sink and the conduit such that a first surface of the thermal energy transfer device is outside a surface of the conduit and a second surface of the thermal energy transfer device is in contact with the cold sink,
    wherein the thermal energy transfer device is configured to capture a second portion of thermal energy still present within the interior space while the thermal energy transfer device transfers the first portion of the thermal energy to the liquid within the conduit; and
    a pump configured to move liquid containing the first portion of thermal energy away from the interior space.

15. The system of claim 14, wherein the computing device comprises a server.

16. The system of claim 14, wherein the thermal energy transfer device comprises a thermoelectric cooler.

17. The system of claim 14, wherein the liquid comprises water.

18. The system of claim 14, further comprising a housing that defines the interior space.

19. The system of claim 18, wherein the housing substantially seals the interior space.

20. The system of claim 18, wherein the one or more electronic components are contained within the housing.

* * * * *